United States Patent [19]

Stoll et al.

[11] Patent Number: 4,925,156

[45] Date of Patent: May 15, 1990

[54] CONTROL CIRCUIT ARRANGEMENT FOR SOLENOID VALVES

[76] Inventors: Kurt Stoll, Lenzhalde 72, 7300 Esslingen, Fed. Rep. of Germany; Hans H. Glättli, Seestrasse 252, CH-8700 Küsnacht, Switzerland

[21] Appl. No.: 279,947

[22] Filed: Dec. 5, 1988

[30] Foreign Application Priority Data

Dec. 9, 1987 [DE] Fed. Rep. of Germany ....... 3741619

[51] Int. Cl.$^5$ .............................................. F16K 31/06
[52] U.S. Cl. ........................ 251/129.01; 251/129.04; 361/154; 123/490
[58] Field of Search ..................... 251/129.01, 129.04; 361/154; 123/490

[56] References Cited

U.S. PATENT DOCUMENTS

| | | | |
|---|---|---|---|
| 4,169,401 | 10/1979 | Walker | 361/154 X |
| 4,680,667 | 7/1987 | Petrie | 361/154 |
| 4,729,056 | 3/1988 | Edwards et al. | 361/154 X |
| 4,742,988 | 5/1988 | Haneda et al. | 251/129.04 X |

Primary Examiner—Arnold Rosenthal
Attorney, Agent, or Firm—McGlew & Tuttle

[57] ABSTRACT

The invention provides a control circuit arrangement for solenoid valves, which has a timer adapted to supply the solenoid valve with a higher attraction current during an adjustable time starting with the beginning of a switching signal for the solenoid valve. After the time interval a low hold current flows until the end of the switching signal. For this purpose there is a semiconductor switch adapted to switch the flow of current through the solenoid valve. A logic gate arrangement is connected with an input of the switch and the gate arrangement is supplied with the output signal of the timer arranged to be triggered by the switching signal and the output signal of an oscillation generator. This circuit arrangement makes is possible to reduce a higher attraction current to a lower hold current in a simple and cheap manner, there only being a small overall size and as significant advantages it is possible for the arrangement to be converted for complementary logic.

38 Claims, 5 Drawing Sheets

CONTROL CIRCUIT ARRANGEMENT FOR SOLENOID VALVES

BACKGROUND OF THE INVENTION

The invention relates to a control circuit arrangement for solenoid valves comprising a timer adapted to supply the solenoid valve with a higher attraction current during a preset time interval as from the beginning of a solenoid valve operating signal so that after the end of the time interval a lower holding current flows until the end of the operating signal.

In order to prevent overheating of solenoid valves and in order to reduce the current requirement it is a known practice initially to supply solenoid valves with a high attraction current which ensures reliable attraction by the solenoid valve and then to switch over to a very much lower holding current, which ensures that the solenoid valve is maintained in the attracted condition. As an example, a given type of solenoid valve may be supplied with an attraction current of 220 mA during a time of 20 msecs and after this the current is then reduced to 17 mA. Circuits for performing such a function are more particularly to be found with an analog (as opposed to digital) function. In order to attain reproducible operation it is necessary for the operating voltages to be very precisely observed. Furthermore, substantial operating powers are required. There are also system limits as regards the possibility of integration and of arrangement in very small spaces, more especially as regards the capacitors required.

SHORT SUMMARY OF THE PRESENT INVENTION

One object of the invention is to devise a control circuit arrangement for solenoid valves of the initially specified type which while having a low control power makes possible a larger control voltage range.

A further object of the invention is to devise such a system which makes possible arrangement in a very small space.

In order to achieve these or other objects appearing from the present specification, claims and drawings the circuit is so designed that there is a semiconductor switch switching the flow of current to the solenoid valve and whose input is connected with a logical gate arrangement which is supplied with the output signal of the timer adapted to be triggered by the switching signal and with the output signal of an oscillation generator.

The digital circuit arrangement specified only requires such a low control power that it may be operated by a TTL or HCMOS circuits. The control voltage range may be adapted to be varied within wide limits by simple means. For the gate arrangement it is possible to use commercially available multiple circuits, which render the arrangement simple in structure and inexpensive to produce. In this respect the space requirement is so low that the arrangement may be with advantage arranged in a male or female connecting element leading to the solenoid valve.

The claims define further very convenient developments and improvements in the control circuit arrangement of the invention.

A particularly simple type of timer in connection with the required gate arrangement consists of a capacitor arranged to be charged via a resistor. In this respect the resistor is preferably shunted by a diode adapted to discharge the capacitor when the voltage fails. This has the advantage that the capacitor firstly has to be charged up again when the voltage is switched on again so that during the charging period the increased attraction current may flow again.

Owing to the use of a negating gate in the gate arrangement as the only active component of an astable multivibrator used as an oscillation generator it is possible not only to have a very simple and low-price multivibrator, but furthermore this gate may then fulfill the further function of a gate arrangement or, respectively, of part of such a gate arrangement. In this respect the gate arrangement conveniently only comprises a single type of gate in order to be able to use low-price and space saving multiple gates which are integrated in a single component. The type of gate used is a NAND gate in an arrangement with positive logic and is a NOR gate in the case of negative logic. In this manner it is possible to change over the circuit arrangement by simple replacement of the gate or of the gates by another type of gate, simply by reversing the polarity of the diodes used and by replacement of the semiconductor switch by such a switch with the opposite type of conductivity. Such a change over may be performed quickly and at a low price. This means that for instance a single printed circuit board fitted with passive components may be used for both types of logic, only the active components having to be replaced or changed around.

A particularly simple type of circuit arrangement is possible if the gate in the multivibrator is the only gate of the gate arrangement and is connected on the output side with the control input of the semiconductor switch, the switching signal also being supplied to the connection, not connected with the semiconductor switch, of the solenoid valve. Since such a gate is usually available as a fourfold or sixfold gate in an integrated component, four or, respectively, six such circuit arrangements may be constructed using a single IC, which on changing over to another type of logic only has to be replaced. The change over may therefore be undertaken in a particularly simple and low-price manner so that the arrangement is of universal applicability.

If there is only a weak switching signal, the gate in the multivibrator is connected via a second identical gate with the control input of the semiconductor switch and the switching signal for the solenoid valve is supplied via an amplifying circuit, made up of further identical gates, to one input of the further gate. In this arrangement it is possible to use switching signals with a very low power and a fixed voltage supply may be provided for excitation of the solenoid valve via the semiconductor switch.

In accordance with a convenient further alternative design the timer has its output connected with an inverting threshold stage, more especially in the form of a Schmitt trigger, whose output and the output of the oscillation generator are connected on the input side with a first gate belonging to the gate arrangement, and the output thereof and the switching signal are applied to a second gate. In the case of a design with positive logic the first gate will be an OR gate and the second gate will be an AND gate, the order being reversed in a design with negative logic. In this case it is thus possible to change over the two gates, by reversing the connection polarity of the diodes used and by replacement of the semiconductor switch by one with the opposite type of conductivity so that there is a rapid adaptation to the logic design. The circuit board, which will more especially be a printed circuit board itself will be left unchanged and may be used for both designs in an identical manner, as has been explained above.

In order to provide decoupling diodes transmitting the potential of the switching signal to the second gate and to the timer are connected with an input terminal receiving this switching signal, such terminal being connected via a resistor with zero potential. In this arrangement as well it is possible to use very low power switching signals, the voltage of the switching signal being able to be greatly varied within wide limits since these diodes prevent the supply of high voltages to the circuit arrangement.

Simple monitoring of the switching signal or signals derived therefrom is preferably effected by an LED which is arranged in series with a current limiting resistor and mounted on the part to be monitored.

The arrangement of the circuit arrangement in a female or male connecting element leading to the solenoid valve makes it possible to have a small space requirement for these parts. In this respect it is also possible to have multiple connecting elements for a number of solenoid valves, the use of multiple gates making it possible to make the number of integrated components less than the number of solenoid valves which are to be operated. Owing to the accommodation in a plug connecting element it is also possible to maintain the switching on function during the replacement of one of more solenoid valves.

The power supply for the semiconductor components used is preferably derived from the switching signal, if the latter has a sufficient power level for operation of the solenoid valve. In this case only two supply leads are required.

In the case of low-power switching signals an additional power supply line is required for the solenoid valve, from which in turn the power supply for the semiconductor components used in the circuit arrangement itself may be derived. In either case it is sufficient in this respect to have a single Z-diode, which is connected via a resistor with the switching signal or with the power supply for the solenoid valve. The voltage level both of the switching signal and also of the switching voltage may thus be varied by the designer within wide limits and for different types of solenoid valves without this impairing the function and the performance of the logic components.

Working examples of the invention will now be described with reference to the drawings in what follows.

DETAILED ACCOUNT OF WORKING EMBODIMENTS OF THE INVENTION

Figure 1:
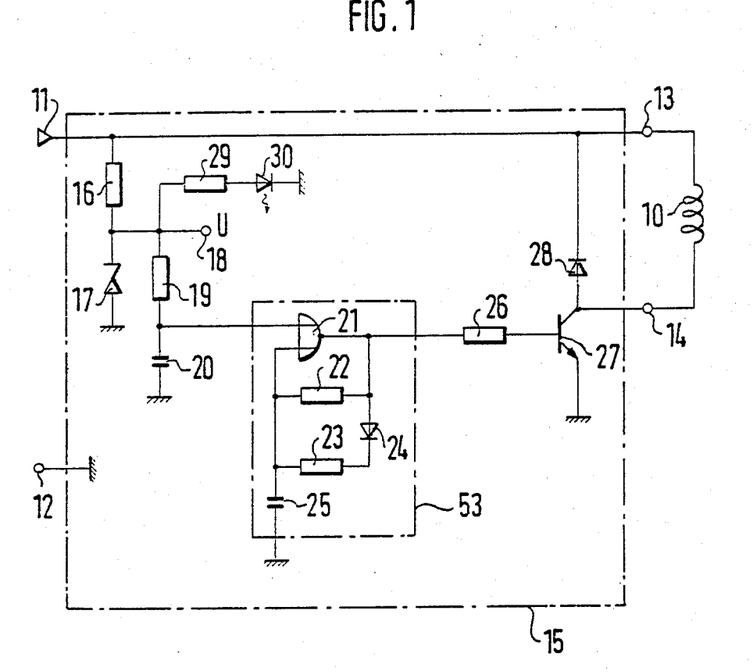
FIG. 1 is a circuit diagram of a first working example of a circuit arrangement for high power switching or operating signals with a single gate according to the invention.

The first working embodiment shown in FIG. 1 comprises a solenoid valve 10 operated by means of a switching signal, which is applied to two terminals 11 and 12. The terminal 12 is in this respect at zero or ground potential. The solenoid valve 10 is shown in a simplified manner as a winding, which is connected via two terminals 13 and 14 with the circuit arrangement. This circuit arrangement may for instance be incorporated in a male plug connecting element 15, the terminals 13 and 14 then representing the plug pins or the female elements therefor, while the terminals 11 and 12 are attached to a supply cable.

In order to provide the operating power or voltage U of generally 5 volts required for integrated components, more especially logic components, the terminals 11 and 12 are connected with each other via a series circuit arrangement consisting of a resistor 16 and a Z-diode 17. The Z-diode 17 in this case has a Z-voltage of 5 volts, the voltage at the Z-diode 17 being supplied to an operating voltage terminal 18. A timer consisting of a resistor 19 with a capacitor 20 is connected between the operating voltage terminal 18 and the terminal 12. The voltage of the capacitor 20 is supplied to an astable multivibrator, which consists of a NAND gate 21, two resistors 22 and 23, a diode 24 and a capacitor 25. In this respect the voltage of the capacitor 20 is supplied to one input of the NAND gate 21, whose output is connected via the one resistor 22 with its second input. Parallel to the resistor 22 a series circuit arrangement made up of the other resistor 23 with the diode 34, is connected, the anode thereof being connected with the output of the NAND gate 2. Furthermore the second input of this NAND gate 21 is connected via the capacitor 25 with the terminal 12.

The output of the NAND gate 21, which also represents the output of the astable multivibrator, is connected via a resistor 26 with the base of an npn power transistor 27, whose emitter is connected with the terminal 12 and whose collector is connected with the terminal 14. The two terminals 13 and 14 are connected with each other via a flywheel diode 28 for the solenoid valve 10.

The series circuit arrangement made up of a resistor 29 and an LED 30 is placed between the terminals 18 and 12.

If there is no switching or operating voltage at the terminals 11 and 12 it is not possible for any operating voltage to be produced either so that the capacitors 20 and 25 are discharged and the solenoid valve 10 cannot be excited.

If now a switching signal arrives, the operating voltage U will be present at the operating voltage terminal 18, such voltage causing the charging of the capacitor 20 to start via the resistor 19. At the same time the LED 30 is switched on to thus indicate the presence of the switching signal.

At the start of the charging of the capacitor 20 there will be a logical zero signal at the input of the NAND gate 21 connected with the capacitor 20, such signal causing a logical one signal to act at the output. This one signal acts via the diode 24, the resistor 23 and the resistor 22 to cause the capacitor 25 also to be charged. Furthermore the one signal at the output of the NAND gate 21 causes the transistor 27 to be turned on and thus the solenoid valve 10 is switched. The current flowing at this time through the solenoid valve is a very high attracting current, which ensures reliable switching.

If owing to the progressive charging the voltage of the capacitor 20 exceeds a value which is interpreted by the NAND gate 21 as a one signal, the signal at the output of this NAND gate 21 will change from a one signal to a zero signal owing to the capacitor 25 which is also charged at this point in time. The transistor 27 is accordingly turned off. The capacitor 25 will discharge via the resistor 22 until its voltage is interpreted by the NAND gate 21 as a zero signal, whereupon its output signal will become a one signal again, which will turn on the transistor 27 again. The multivibrator 21 to 25 is thus caused to produce a high frequency signal series, such frequency depending on the values of the resistors 22 and 23 and on the value of the capacitor 25. This frequency will for instance be equal to 20 kHz in order to be outside the audible range so that it is not possible for the solenoid valve 10 to be released by this rapid signal variation. The pulse duty factor is also dictated by the values of the resistors 22 and 23 and determines the effective current through the solenoid valve 10. This current is markedly reduced in comparison with the initial attraction current, for instance to 1/10 to 1/20 of its original value. This low hold current is sufficient to keep the solenoid valve 10 in the attracted state. It is only when the switching signal is discontinued that the solenoid valve 10 will return back to its original state and the capacitors 20 through 25 may completely discharge.

Figure 2:
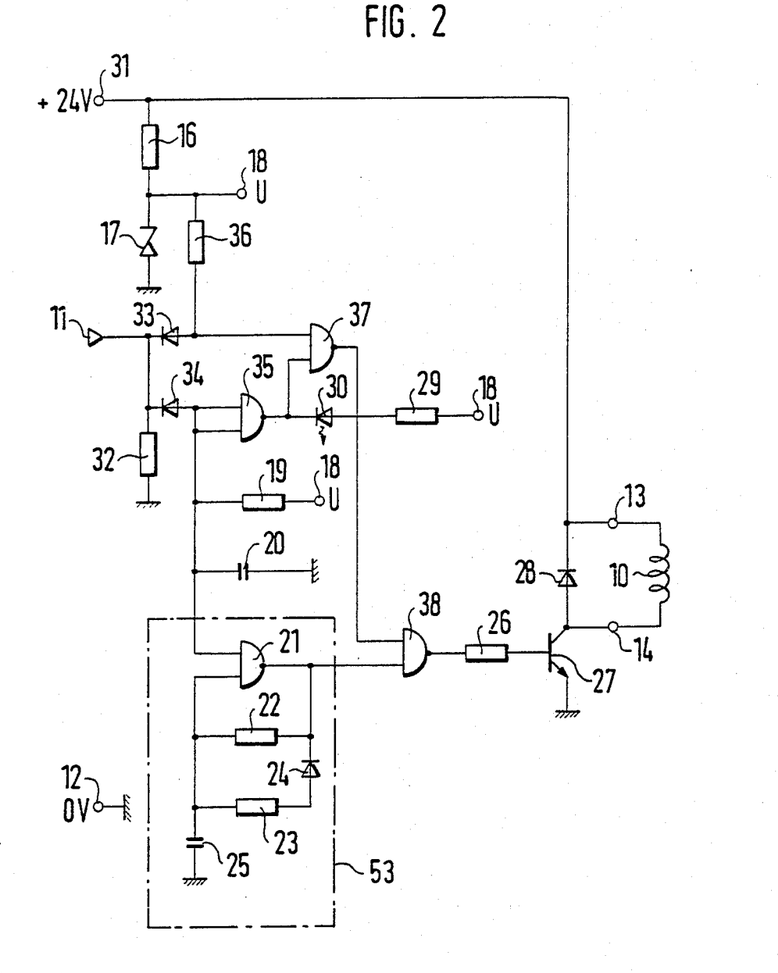
FIG. 2 is a circuit diagram of a second embodiment for low power switching signals with an amplifying arrangement.

The second form of the invention to be seen in FIG. 2 is in principle identical to the first working example of the invention, like components being given like references. Unlike the first example the circuit arrangement now described is suitable for switching signals which have such a low power that they may not be used for operating the solenoid valve 10 or to have the operating power derived from them for operating the electronic components. For this reason a supply voltage of 24 volts as a switching voltage is supplied via a further terminal 31 as an operating voltage for the solenoid valve 10. This further terminal 31 is connected as in the first working example of the invention for producing the operating voltage with the terminal 18 with the resistor 16 and the Z-diode 17 so that there is again the required operating voltage of 5 volts at the terminal 18.

The terminal 11 is connected via a resistor 32 with the terminal 12 at zero potential. Furthermore this terminal 11 is connected with the cathodes of two diodes 33 and 34, the anode of the diode 34 being connected with the two inputs of a NAND gate 35 and with the connection point between the resistor 19 and the capacitor 20. The anode of the diode 33 is connected via a resistor 36 with the terminal 18 and with one input of a further NAND gate 37, whose second input is connected with the output of the NAND gate 35. The output of this NAND gate 27 is connected via a further NAND gate 38 with the resistor 26, via which as indicated in the first working example the control of the transistor 27 takes place.

The timer 19 and 20 and the astable multivibrator 12 through 25 are as in the first working example of in the invention, in which respect the output of this astable multivibrator is connected with the second input of the NAND gate 38. The diode 24 of the astable multivibrator is oppositely connected as compared with the first example of the invention so that the resistor 23 now represents an additional discharge resistor for the capacitor 25, while in the first example it was connected as an additional charging resistor. In this manner as well it is possible to modify the setting of the desired frequency of the astable multivibrator additionally.

The LED 30 connected in series with the resistor 29 is placed between the terminal 18 and the output of the NAND gate 35.

The supply leads for the circuit arrangement shown in FIG. 2 are now in the form of a cable having at least three cores and which is to be connected with the terminals 11, 12 and 31. This circuit arrangement as well may be arranged in a connecting plug element.

Figure 3:
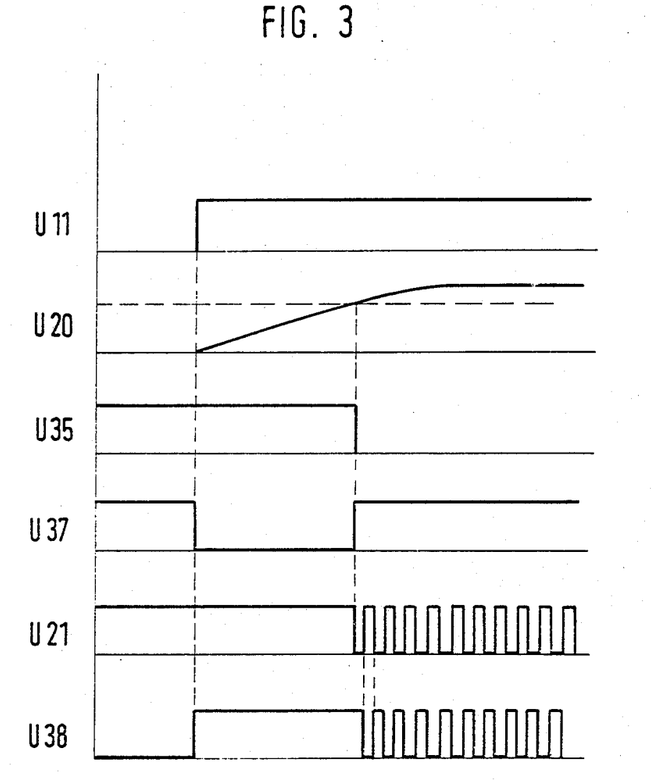
FIG. 3 is a signal diagram in order to explain the manner of operation of the embodiment shown in FIG. 2.

The manner of operation of the second working example of the invention shown in FIG. 2 will now be explained with reference to the signal diagram of FIG. 3. In this diagram the respective number after the voltage signal U indicated the relation of the signal indicated to components, the respective output signal being denoted in the case of the gates.

Irrespectively of whether a switching signal $U_{11}$ is present at the terminal 11 or not the terminal 31 is constantly supplied with the power or operating voltage so that the terminal 18 always has the operating voltage. If now a switching signal $U_{11}$ arrives at the terminal 11, th diodes 33 and 34 will be turned off which serve as guard diodes for protection against incorrect polarity of the switching signal and excessively high voltages. Owing to the charging operation of the capacitor 20 the voltage $U_{20}$ builds up. There will now be one signals at the inputs of the NAND gate 37 so that it will now produce a zero signal at its output, same in turn producing a one signal at the output of the NAND gate 38. The gate 38 turns on the transistor 27 so that the solenoid valve 10 is switched.

This condition is maintained until the capacitor voltage $U_{20}$ exceeds a certain value which is interpreted by the NAND gates 21 and 35 as a one signal. Following this the outputs of the NAND gates 21, 35 and 37 are switched to the respectively opposite logical potential. At the output of the NAND gate 38 there is initially no change in potential, since the output of the NAND gate 21 has switched over to a zero signal. However the astable multivibrator now begins to oscillate in the manner described as is indicated by the series $U_{21}$ of signals. As a consequence of this an inverse series of pulses appears at the output of the NAND gate 38, by which the transistor 27 is correspondingly switched so that in the manner described are much reduced effective hold current is produced for the solenoid valve 10.

The LED 30 is only switched on when a zero signal appears at the output of the NAND gate 35, that is to say when the multivibrator has begun to oscillate.

The arrangement illustrated constitutes in fact an amplifying arrangement for the very low power switching signal $U_{11}$. This signal may not only be very low in power but also may have varying voltage values. Furthermore for adaptation to different types of valves the supply voltage or power at the terminal 31 may be varied between 5 volts and a high value, which may even be in excess of 24 volts. In the case of power switching signals the terminals 11 and 31 may be connected with each other so that it is not necessary to have an additional supply voltage.

Figure 4:
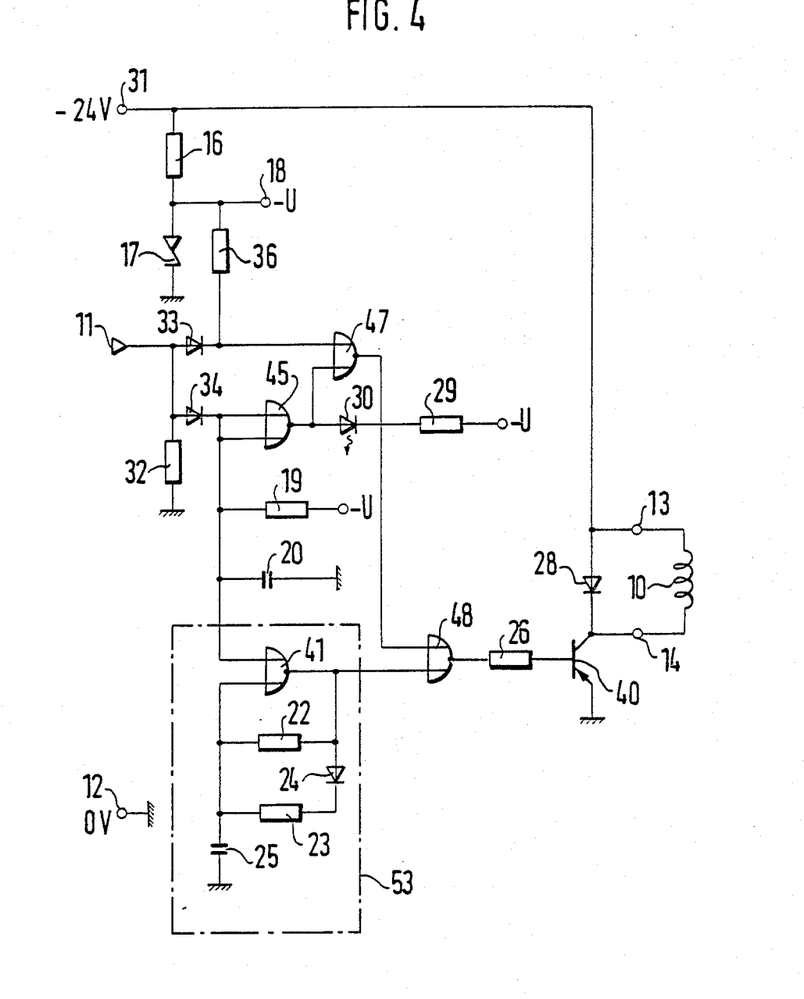
FIG. 4 is a circuit diagram of a third working example which is generally similar to the second example but has a negative logic system.

The third form of the invention shown in FIG. 4 has the following departures from the second example shown in FIG. 2 (to which it is similar as regards its circuit design): the four NAND gates 21, 35, 37, and 38 are replaced by four NOR gates 41, 45, 47 and 48. The npn transistor 27 is replaced by a pnp transistor 40. The diodes 17, 24, 28, 40, 33 and 34 are reversed in the polarity of their connections. In place of a positive supply or power voltage of 24 volts there is a negative one of −24 volts at the terminal 31.

The circuit arrangement shown in FIG. 4 thus operates with "negative logic", in which the entire voltage range is under the zero potential, in contrast to the "positive logic" in which the reverse is the case. The working examples of the invention shown in FIGS. 1 and 2 operate with positive logic.

The manner of operation is the same as that of the second example shown in FIG. 2 so that a repetition of the description is not required. The polarities of the voltages occurring obviously have respectively inverse polarities.

A comparison between the FIGS. 2 and 4 will make clear a substantial advantage of these circuits. In fact, both circuits may use the same printed circuit board, which is fitted with the same passive components. The circuit board may be produced in a uniform manner for both types of logic, and for changing over to the other type of logic it is only necessary to change over the polarities of the diodes and for the transistor and the gates to be replaced by other ones. Such gates are commercially available as fourfold gates. That is to say it is a question of four identical gates in a single IC package. For instance for the four NAND gates it is possible to use the component HC 132 and for the four NOR gates it is possible to use the component HC 7002. By the replacement of a single component it is thus possible to replace all the gates.

Figure 5:
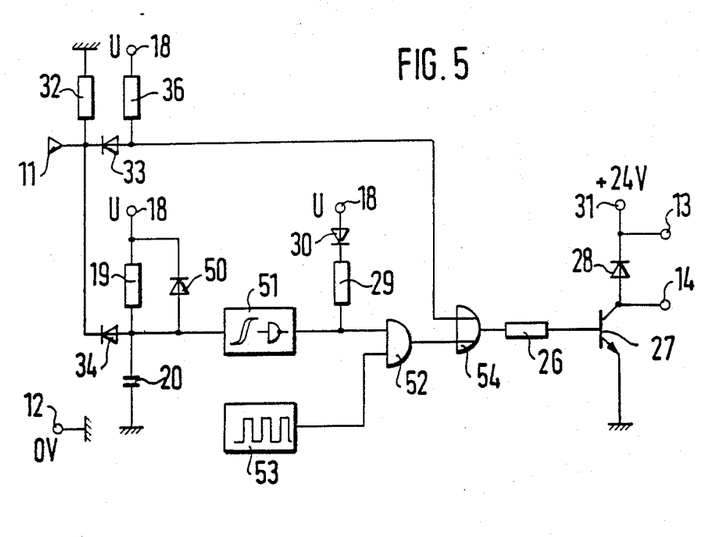
FIG. 5 is a circuit diagram of a fourth working example of the invention with an inverting Schmitt trigger.

In the case of the third embodiment of the invention shown in FIG. 5 components which are identical or have the same function are provided with the same reference characters and are not described again. Thus for instance the input connections of the terminal 11 and the timer are illustrated in FIG. 2. The derivation of the operational voltage at the terminal 18 from the supply voltage present at the terminal 31 of 24 volt may also take place as in the previously described working embodiments, or this operating voltage may be derived from the switching signal. This is not shown in detail again in order to simplify the drawing.

The resistor 19 of the timer 19 and 20 is shunted by a discharge diode 50 for rapidly discharging the capacitor 20 when the voltage fails. This capacitor 20 is furthermore connected with the input of an inverting Schmitt trigger 51, whose output is connected with the one input of an OR gate 62. In place of the Schmitt trigger 51 it is in principle also possible to have another inverting threshold stage. A diagrammatically illustrated oscillation generator 53 is connected with the second input of the OR gate 52, whose output is connected with one input of an AND gate 54, whose second input is connected with the anode of the diode 33. As an oscillation generator 53 is would be possible to use an astable multivibrator as described in detail in the previous working examples of the invention. Lastly the output of the AND gate is connected via the resistance 26 with the base of the transistor 27.

The series circuit arrangement of the LED 30 with the resistor 29 is placed between the terminal 18 and the output of the Schmitt trigger 51.

If the terminal 11 is supplied with a zero signal, that is to say if there is no switching signal, the AND gate 54 will be turned off although there is a one signal at the output of the inverting Schmitt trigger 51 and thus at the output of the OR gate 52. If now a switching signal is supplied to the terminal 11, the charging operation of the capacitor 20 will begin through the resistor 19. On reaching the switching threshold of the Schmitt trigger 51 its output will be changed over from a one signal to a zero signal so that the oscillation signal sequence from the oscillation generator 53 will take effect at the AND gate 54 and the latter will be switched over at each pulse. At the same time the LED 30 will be turned on. Such pulse also causes the transistor 27 to be turned on and off so that, as in the previous examples of the invention, the initially high attraction force will be reduced to a low holding current.

Even in the event of the supply failing for a short time the capacitor 20 will be very rapidly discharged via the discharge diode 50 so that when the supply is switched on again the first event will be the charging of this capacitor 20 again, which will ensure the high attraction current for the solenoid valve. Without this discharge diode 50 there would be a danger of there being a release of the solenoid valve following a short time of current failure, but the capacitor 20 would not discharge down to a value under the switching threshold of the Schmitt trigger 51 and when the supply power or operating voltage would re-appear the transistor 27 would immediately change over to the pulsed mode of operation. The resulting low hold current would then not be sufficient to operate the solenoid valve.

Figure 6:
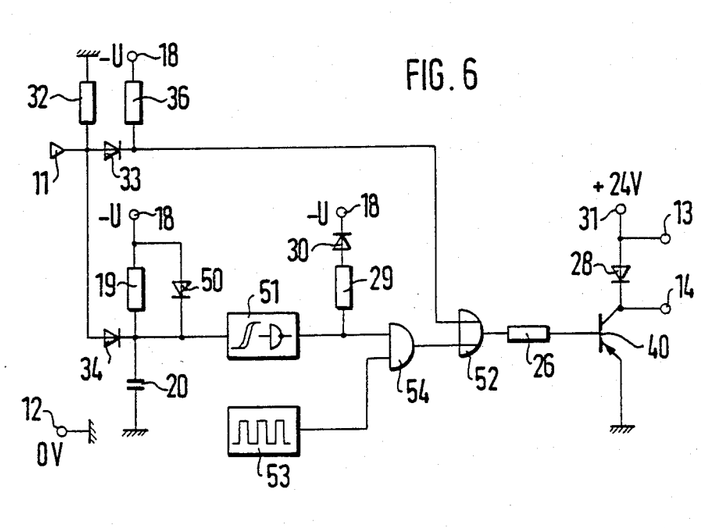
FIG. 6 is a circuit diagram of a fifth embodiment which is generally similar to the fourth embodiment but having a negative logic system.

The fifth working example shown in FIG. 6 is generally similar to the fourth working example described above and unlike it is designed for negative logic. In order to convert the circuit arrangement shown in FIG. 5 for positive logic into an circuit arrangement as in FIG. 6 the following measures are necessary: the two gates 52 and 54 are changed over, the transistor 27 is replaced by the transistor 40, the diodes 28, 30, 33, 34 and 50 have the polarity of their connections changed over and the oscillation generator 53 is adapted to a negative series of pulses, as for instance in accordance with the preceding examples. In this respect it may also be necessary to adapt the resistors determining the frequency. The manner of operation will again be as in the working example shown in FIG. 5, the signals and voltages occurring having the respectively opposite polarity.

The Schmitt trigger 562 51 is for example a sixfold gate in the form of the IC HC 14, the OR gate 52 may be a fourfold gate in the form of the IC HC 32 and the AND gate 54 may be a fourfold gate component such as HC 08 as are commercially available. It is thus possible for respectively four or six circuit arrangements to be fitted with one of these components in each case, this leading to a lower price, simplification and reduction in volume. Such multiple designs may for instance be used in multiple male or female connectors such as flat connectors for control or power supply of a number of solenoid valves.

This will obviously be the case for the above described working examples, more particularly the first one. It is also to be noted at this juncture that the first working example of the invention as shown in FIG. 1 may be constructed for negative logic if suitable adaptive measures are implemented.

We claim:

1. A control circuit arrangement for a solenoid valve comprising a timer adapted to supply the solenoid valve with a higher attraction current for an adjustable time interval as from the commencement of a switching signal and for the supply of a lower hold current as from the end of said time interval until the end of the switching signal, a semiconductor switch adapted to switch a flow of current through the solenoid valve, a logic gate arrangement connected with an input of the semiconductor switch, said gate arrangement having means for the supply thereto of output signals from said timer, which is adapted to be triggered by said switching signal, and an oscillation generator, which is also arranged to supply an output signal thereof to the gate arrangement wherein the timer consists of a capacitor adapted to be charged via a resistor, such capacitor being connected with an input of the gate arrangement, wherein a negating gate included in said gate arrangement forms the only active component of the oscillation generator which is in the form of an astable multivibrator, the gate arrangement only comprising one type of gate, wherein in the case of positive supply voltage in relation to the zero potential the gate type is a NAND gate and in the case of a negative supply voltage in relation to the zero potential the gate type is a NOR gate, wherein the oscillation generator consists of the gate and a capacitor connected with its input, such capacitor being connected via charging and discharging connections with the output of the gate.

2. The control circuit arrangement as claimed in claim 1 comprising a diode shunting the resistor and adapted to discharge the capacitor when the voltage fails.

3. The control circuit arrangement as claimed in claim 1 comprising an inverting threshold stage more particularly in the form of a Schmitt trigger connected with the output of the timer and an output of the threshold stage and the output of the oscillation generator are connected inputwise with a first gate forming part of the gate arrangement, an output of gate being supplied with the switching signal to a second gate.

4. The control circuit arrangement as claimed in claim 1 wherein in the case of positive voltage supply in relation to zero potential the first gate is in the form of an OR gate and the second gate is in the form of an AND gate and in the case of a negative supply voltage in relation to the zero potential the order is reversed.

5. The control circuit arrangement as claimed in claim 1 wherein diodes transmitting the potential of the switching signal to the second gate and to the timer are connected with an input terminal able to receive this switching signal, such terminal being connected via a resistor with zero potential.

6. The control circuit arrangement as claimed in claim 1 comprising for all similar gates one circuit arrangement and/or for the similar gates of circuit arrangements controlling several solenoid valves a number of individual gates contained in integrated circuits.

7. The control circuit arrangement as claimed in claim 1 arranged in a male or female connector element.

8. The control circuit arrangement as claimed in claim 7 wherein multiple male or female connecting elements are provided for a plurality of solenoid valves.

9. The control circuit arrangement as claimed in claim 1 wherein the supply voltage for semiconductor components used therein is arranged to be derived from the switching voltage for the solenoid valve.

10. A control circuit arrangement for a solenoid valve comprising a timer adapted to supply the solenoid valve with a higher attraction current for an adjustable time interval as from the commencement of a switching signal and for the supply of a lower hold current as from the end of said time interval until the end of the switching signal, a semiconductor switch adapted to switch a flow of current through the solenoid valve, a logic gate arrangement connected with an input of the semiconductor switch, said gate arrangement having means for the supply thereto of output signals from said timer, which is adapted to be triggered by said switching signal, and an oscillation generator, which is also arranged to supply an output signal thereof to the gate arrangement wherein the timer consists of a capacitor adapted to be charged via a resistor, such capacitor being connected with an input of the gate arrangement, wherein a negating gate included in said gate arrangement forms the only active component of the oscillation generator which is in the form of an astable multivibrator, the gate arrangement only comprising one type of gate, wherein the gate in the oscillation generator is the only gate in the gate arrangement and on an output side thereof is connected with a control input of the semiconductor switch, means being provided for also supplying the switching signal directly to the terminal, not connected with the semiconductor switch, of the solenoid valve.

11. The control circuit arrangement as claimed in claim 10 comprising a diode shunting the resistor and adapted to discharge the capacitor when the voltage fails.

12. The control circuit arrangement as claimed in claim 10 comprising an inverting threshold stage more particularly in the form of a Schmitt trigger connected with the output of the timer and an output of the threshold stage and the output of the oscillation generator are connected inputwise with a first gate forming part of the gate arrangement, an output of gate being supplied with the switching signal to a second gate.

13. The control circuit arrangement as claimed in claim 10 wherein the case of positive voltage supply in relation to zero potential the first gate is in the form of an OR gate and the second gate is in the form of an AND gate and in the case of a negative supply voltage in relation to the zero potential the order is reversed.

14. The control circuit arrangement as claimed in claim 10 wherein diodes transmitting the potential of the switching signal to the second gate and to the timer are connected with an input terminal able to receive this switching signal, such terminal being connected via a resistor with zero potential.

15. The control circuit arrangement as claim in claim 10 comprising for all similar gates one circuit arrangement and/or for the similar gates of circuit arrangements controlling several solenoid valves a number of individual gates contained in integrated circuits.

16. The control circuit arrangement as claimed in claim 21 arranged in a male or female connector element.

17. The control circuit arrangement as claimed in claim 16 wherein multiple male or female connecting elements are provided for a plurality of solenoid valves.

18. The control circuit arrangement as claimed in claim 10 wherein the supply voltage for semiconductor components used therein is arranged to be derived from the switching voltage for the solenoid valve.

19. The control circuit arrangement as claimed in claim 18 wherein the amplifying circuit comprises two gates connected in series, of which respectively one input is connected via diodes transmitting the potential of the switching signals to these inputs with an input terminal arranged to be acted upon by this switching signal, such terminal being connected via a resistor with zero potential and the capacitor voltage of the timer is additionally supplied to the gate on the input side in the series circuit arrangement and the switching signal is only supplied to the input of the amplifying arrangement after the adjustable time interval.

20. A control circuit arrangement for a solenoid valve comprising a timer adapted to supply the solenoid valve with a higher attraction current for an adjustable time interval as from the commencement of a switching signal and for the supply of a lower hold current as from the end of said time interval until the end of the switching signal, a semiconductor switch adapted to switch a flow of current through the solenoid valve, a logic gate arrangement connected with an input of the semiconductor switch, said gate arrangement having means for the supply thereto of output signals from said timer, which is adapted to be triggered by said switching signal, and an oscillation generator, which is also arranged to supply an output signal thereof to the gate arrangement wherein the timer consists of a capacitor adapted to be charged via a resistor, such capacitor being connected with an input of the gate arrangement, wherein a negating gate included in said gate arrangement forms the only active component of the oscillation generator which is in the form of an astable multivibrator, the gate arrangement only comprising one type of gate, wherein the gate in the oscillation generator is connected via a second identical gate with the control input of the semiconductor switch, the switching signal for the solenoid valve being arranged to be supplied via an amplifying circuit consisting of identical further gates to an input of the further gate.

21. The control circuit arrangement as claimed in claim 20 comprising a diode shunting the resistor and adapted to discharge the capacitor when the voltage fails.

22. The control circuit arrangement as claimed in claim 20 comprising an inverting threshold stage more particularly in the form of a Schmitt trigger connected with the output of the timer and an output of the threshold stage and the output of the oscillation generator are connected inputwise with a first gate forming part of the gate arrangement, an output of gate being supplied with the switching signal to a second gate.

23. The control circuit arrangement as claim in claim 20 wherein in the case of positive voltage supply in relation to zero potential the first gate is in the form of an OR gate and the second gate is in the form of an AND gate and in the case of a negative supply voltage in relation to the zero potential the order is reversed.

24. The control circuit arrangement as claimed in claim 20 wherein diodes transmitting the potential of the switching signal to the second gate and to the timer are connected with an input terminal able to receive this switching signal, such terminal being connected via a resistor with zero potential.

25. The control circuit arrangement as claimed in claim 20 comprising for all similar gates one circuit arrangement and/or for the similar gates of circuit arrangements controlling several solenoid valves a number of individual gates contained in integrated circuits.

26. The control circuit arrangement as claimed in claim 20 arranged in a male or female connector element.

27. The control circuit arrangement as claimed in claim 26 wherein multiple male or female connecting elements are provided for a plurality of solenoid valves.

28. The control circuit arrangement as claimed in claim 20 wherein the supply voltage for semiconductor components used therein is arranged to be derived from the switching voltage for the solenoid valve.

29. A control circuit arrangement for a solenoid valve comprising a timer adapted to supply the solenoid valve with a higher attraction current for an adjustable time interval as from the commencement of a switching signal and for the supply of a lower hold current as from the end of said time interval until the end of the switching signal, a semiconductor switch adapted to switch a flow of current through the solenoid valve, a logic gate arrangement connected with an input of the semiconductor switch, said gate arrangement having means for the supply thereto of output signals from said timer, which is adapted to be triggered by said switching signal, and an oscillation generator, which is also arranged to supply an output signal thereof to the gate arrangement, comprising an LED adapted to light up on the occurrence of the switching signal or after the end of the adjustable time interval, such LED being connected in series with a current limiting resistor.

30. The control circuit arrangement as claimed in claim 29 comprising for all similar gates one circuit arrangement and/or for the similar gates of circuit arrangements controlling several solenoid valves a number of individual gates contained in integrated circuits.

31. The control circuit arrangement as claimed in claim 29 arranged in a male or female connector element.

32. The control circuit arrangement as claimed in claim 31 wherein multiple male or female connecting elements are provided for a plurality of solenoid valves.

33. The control circuit arrangement as claimed in claim 29 wherein the supply voltage for semiconductor components used therein is arranged to be derived from the switching voltage for the solenoid valve.

34. A control circuit arrangement for a solenoid valve comprising a timer adapted to supply the solenoid valve with a higher attraction current for an adjustable time interval as from the commencement of a switching signal and for the supply of a lower hold current as from the end of said time interval until the end of the switching signal, a semiconductor switch adapted to switch a flow of current through the solenoid valve, a logic gate arrangement connected with an input of the semiconductor switch, said gate arrangement having means for the supply thereto of output signals from said timer, which is adapted to be triggered by said switching signal, and an oscillation generator, which is also arranged to supply an output signal thereof to the gate arrangement, adapted to derive a supply voltage for the semiconductor components therein from the switching signal, comprising a Z-diode for deriving a supply voltage for the semiconductor components used, which Z-diode is supplied with the switching signal of the switching voltage for the solenoid valve.

35. The control circuit arrangement as claimed in claim 34 comprising for all similar gates one circuit arrangement and/or for the similar gates of circuit arrangements controlling several solenoid valves a number of individual gates contained in integrated circuits.

36. The control circuit arrangement as claimed in claim 34 arranged in a male or female connector element.

37. The control circuit arrangement as claimed in claim 36 wherein multiple male or female connecting elements are provided for a plurality of solenoid valves.

38. The control circuit arrangement as claimed in claim 34 wherein the supply voltage for semiconductor components used therein is arranged to be derived from the switching voltage for the solenoid valve.

* * * * *